United States Patent [19]

Veldkamp et al.

[11] Patent Number: 4,649,351

[45] Date of Patent: Mar. 10, 1987

[54] APPARATUS AND METHOD FOR COHERENTLY ADDING LASER BEAMS

[75] Inventors: Wilfrid B. Veldkamp; James R. Leger; Gary J. Swanson, all of Lexington, Mass.

[73] Assignee: Massachusetts Institute of Technology, Cambridge, Mass.

[21] Appl. No.: 662,609

[22] Filed: Oct. 19, 1984

[51] Int. Cl.$^4$ .......................... H01S 3/08; H04B 9/00
[52] U.S. Cl. ................................ 330/4.3; 350/162.21; 350/162.17; 350/3.84; 372/18; 372/97
[58] Field of Search ...................... 330/4.3; 332/7.51; 350/162.21, 162.24, 162.17, 3.81, 3.72, 3.73; 372/18, 321, 93, 97, 102

[56] References Cited

U.S. PATENT DOCUMENTS

| | | | |
|---|---|---|---|
| 3,691,483 | 9/1972 | Klein | 372/18 |
| 3,763,441 | 10/1973 | Roess | 372/97 |
| 4,168,107 | 9/1979 | Santes | 350/162.24 |
| 4,264,869 | 4/1981 | Hunter | 330/4.3 |
| 4,295,741 | 10/1981 | Palma et al. | 330/4.3 |
| 4,305,666 | 12/1981 | Becherer et al. | 350/3.81 |
| 4,362,359 | 12/1982 | Dammann et al. | 350/162.17 |
| 4,382,660 | 5/1983 | Pratt et al. | 372/18 |
| 4,410,237 | 10/1983 | Veldkamp | 350/320 |
| 4,442,550 | 4/1984 | Killat | 455/608 |

OTHER PUBLICATIONS

Veldkamp et al., "Binary Holographic . . . Arrays", 5/15/83, pp. 1497-1507, Appli, Opt., vol. 22, #10.
Veldkamp, "Holographic Local-Oscillator . . . Detection," 3/15/1983, pp. 891-900, Appl. Opt., vol. 22, #6.
Veldkamp, "Laser Beam Profile . . . Gratings," 9/1/81, pp. 381-386, Opt. Commun., vol. 38, #5, 6.
Veldkamp et al., "Beam Profile . . . Arrays," 1/15/82, pp. 345-356, Appl. Opt., vol. 21, #2.
"Phased Array Diode Lasers", by W. Streifer et al., Laser Focus/Electro-Optics, pp. 100-109, (1984).

Primary Examiner—Nelson Moskowitz
Attorney, Agent, or Firm—Kenway & Jenney

[57] ABSTRACT

The disclosed apparatus includes a diffraction grating illuminated by a plurality of lasers. Apparatus is provided for summing the plurality of lasers coherently by, (a) phase locking the plurality of lasers and by, (b) diffracting the plurality of beams into a single beam. The diffraction grating has a configuration to generate upon illumination substantially equal intensities of diffraction orders corresponding to the number of lasers while suppressing higher unwanted orders. The phase locking can be accomplished by a single master laser, or by a cavity mirror to generate reference beams. Then, the output beams of the plurality of lasers propagating in the reverse direction are coherently superimposed by that grating. It is preferred that the diffraction grating be binary. Both one and two-dimensional diffraction grating arrays are disclosed. In one embodiment, the phase of the plurality of lasers is locked together by means of a separate injection lock laser, in another embodiment the grating is part of a multielement cavity. In a preferred embodiment, the binary grating is a periodic pattern, where the structure of the periodicity is determined by the number of laser beams. Then, an injection lock laser illuminates that grating and locks together the phases of the plurality of lasers whose beams are to be added. Or, alternatively, a mirror is substituted for the injection lock laser and it provides the illumination beam to the grating which then generates the plurality of beams.

12 Claims, 15 Drawing Figures

DIFFRACTION PATTERN
OF 7-BEAM GRATING

7-BEAM COHERENT RECONSTRUCTION

49-BEAM DIFFRACTION PATTERN FORMED BY TWO CROSSED GRATINGS

APPARATUS AND METHOD FOR COHERENTLY ADDING LASER BEAMS

The Government has rights in this invention pursuant to Contract Number F19628-80-C-0002 awarded by the Department of the Air Force.

BACKGROUND OF THE INVENTION

This invention relates to lasers and more particularly to apparatus and method for coherently summing multiple laser beams to produce a high power, coherent source from an array of lasers.

It is highly desirable to be able to combine multiple laser beams to produce a high power coherent source. For example, semiconductor lasers are of relatively low power. Thus, an ability to combine many low power diode lasers to produce a powerful laser beam would enable the use of semiconductor lasers in applications that formerly required high powered lasers. Furthermore, arrays of inherently high powered lasers could be combined to generate ultra high powered laser beams for such uses as laser welding and possibly laser induced fusion. The ability to coherently combine beams from multiple lasers can also allow the control of gas, solid state and dye lasers by a low powered laser or modulator so that a high powered laser beam could be modulated with FM and chirp signals for long distance communications and laser radar imaging.

The ability to combine coherently the beams of low power semiconductor lasers into a single, more intense beam can result in a reduction in the number of repeater stations now necessary in fiber optic communication systems. The complexity of error correcting codes now necessary for low signal-to-noise environments can also be reduced with a higher powered beam.

At present, laser welding and other material processing require bulky and expensive high power gas laser technology. The coherent combining of multiple laser beams would permit a compact, inexpensive semiconductor laser source to have a beam with sufficient intensity for use in laser welding, materials processing and annealing.

A key concept in the coherent addition invention is the build-up of high laser power from low-power laser modules in parallel. At present all powerful laser systems are built in a serial fashion through amplifier stages and starting at a master oscillator level. The weakness of this approach is the progressive difficulty in isolating amplifier stages from parasitic oscillations. In addition, if any of the laser elements fail, the entire system fails in a catastrophic mode. In the parallel addition mode, on the other hand, the degradation of the system due to single element failure is very graceful.

It is therefore an object of this invention to provide apparatus and method for coherently combining the beams from multiple laser sources.

Another object of this invention is such apparatus which can be fabricated using existing techniques.

It is yet another object of this invention to provide apparatus for combining multiple laser beams with a conversion efficiency exceeding 80%.

SUMMARY OF THE INVENTION

The apparatus disclosed herein for coherently combining electromagnetic radiation from a plurality of lasers includes a diffraction grating and a plurality of lasers oriented to illuminate the grating. Apparatus is also provided for locking together the phase of the plurality of lasers. In order to add the laser beams efficiently, the diffraction grating has a configuration to generate substantially equal intensities of diffraction orders corresponding to the number of lasers while suppressing higher orders. It is preferred that the diffraction grating have a binary configuration so that it can be fabricated using current lithographic technology. The diffraction grating may have either a one or two-dimensional pattern.

In a preferred embodiment, the binary grating is a periodic pattern where the structure of a period is determined by the number of lasers. An injection lock laser illuminates the grating and locks together the phases of the plurality of lasers whose beams are to be added. Or, alternatively, a mirror is substituted for the injection-lock laser to provide the master locking beam and the grating generates the plurality of locked beams.

BRIEF DESCRIPTION OF THE DRAWING

The invention disclosed herein will be understood better with reference to the drawing of which:

FIG. 7b illustrates the construction of the grating by repeating the pattern of 7a;

DESCRIPTION OF THE PREFERRED EMBODIMENT

Figure 1:
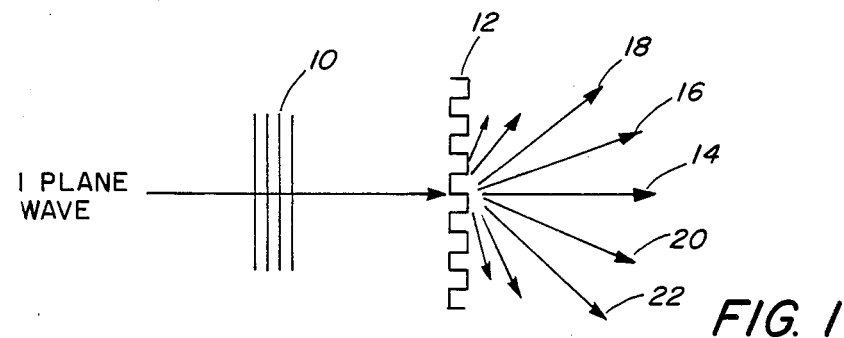
FIG. 1 is a schematic illustration of the action of a conventional binary diffraction grating on a plane wave.
Figure 2:
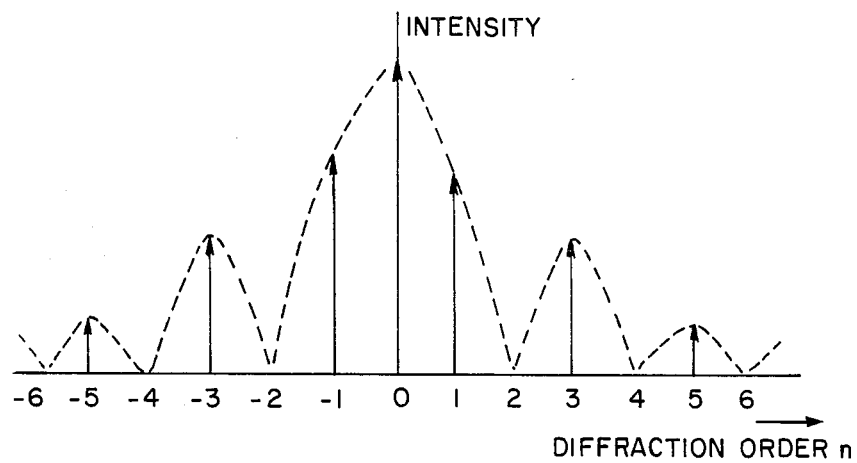
FIG. 2 is a graph illustrating the intensity of the various diffraction orders produced by a conventional binary diffraction grating.

A brief discussion of the interaction of plane waves with diffraction gratings will aid in an understanding of the present invention. In FIG. 1, for example, a plane wave 10 is propagating toward a diffraction grating 12. The diffraction grating 12 will diffract the plane wave 10 into a series of plane waves 14, 16, 18, 20 and 22 and so forth. The plane wave 14 is known as the zero order wave. The plane wave 16 and 20 are known as the +1 and −1 order waves respectively. Similarly, the plane waves 18 and 22 are the +2 and −2 order waves, etc. The diffraction grating 12 in FIG. 1 is known as a binary diffraction grating because the relief pattern has two phase levels only. In most cases, a conventional diffraction grating will diffract a plane wave such that the intensities of the waves vary with the diffraction order. This situation of a conventional grating is illustrated in FIG. 2. In this case, the intensities are asymptotically decreasing as approximately $(1/n)^2$ where n is the diffraction order.

Figure 3:
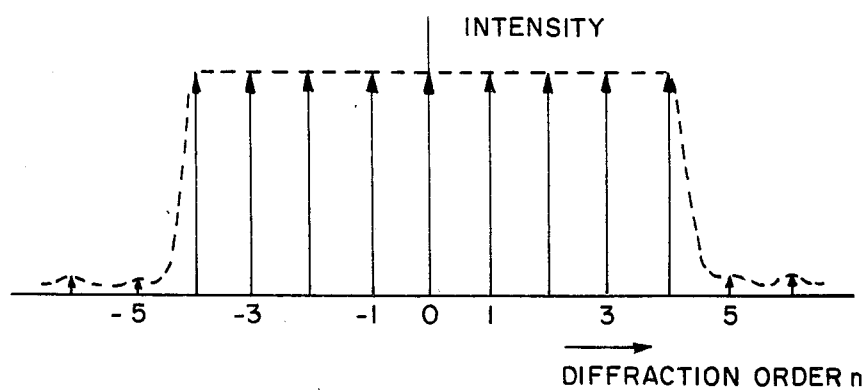
FIG. 3 is a graph of the desired dispersion characteristics of the diffraction grating.

The applicants herein recognized that multiple coherent beams of equal amplitude can be generated from a single laser beam if a diffraction grating could be made having the diffraction characteristics illustrated in FIG. 3. Note in FIG. 3 that the intensities of a finite number of grating orders are substantially equal with the intensities of higher orders highly suppressed. If the grating 12 of FIG. 1 had the appropriate profile (to be described below), the intensities of the beams 14, 16, 18, 20 and 22 would be equal as shown in FIG. 3. This method can be applied to any number of laser beams. Grating profiles can also be generated to coherently add multiple laser beams of unequal amplitudes.

Figure 4A:
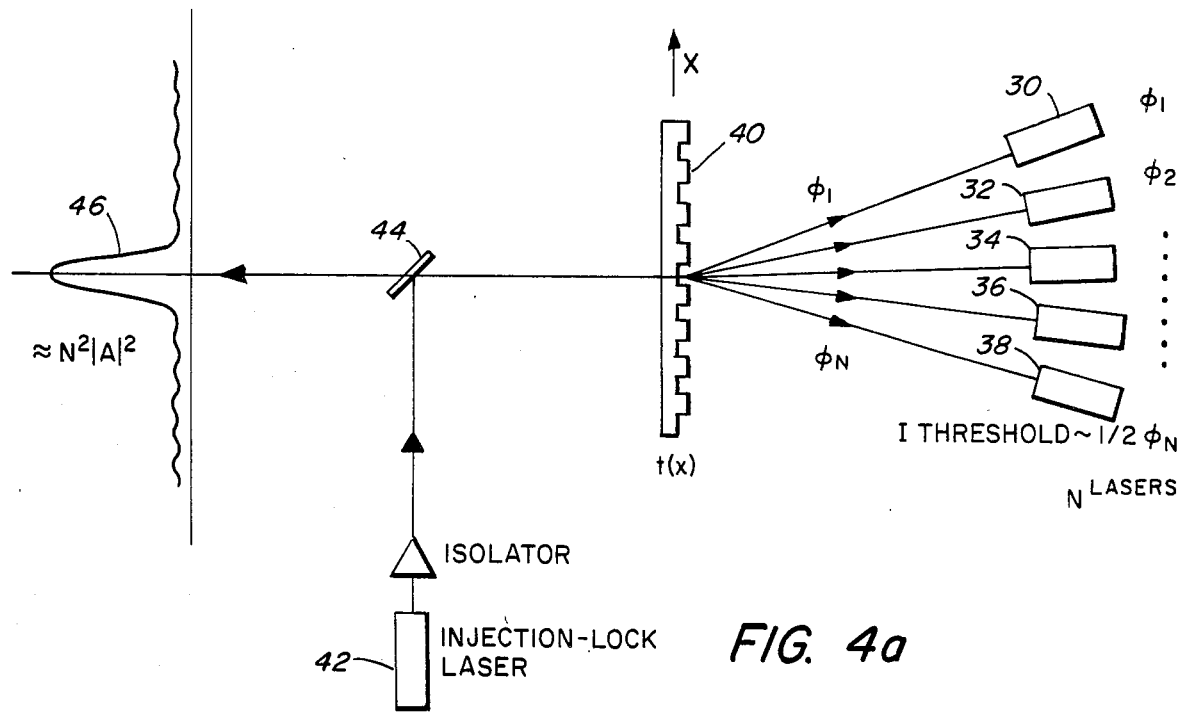
FIGS. 4a and 4b are the schematic illustrations of a one-dimensional embodiment of the invention disclosed herein.
Figure 4B:
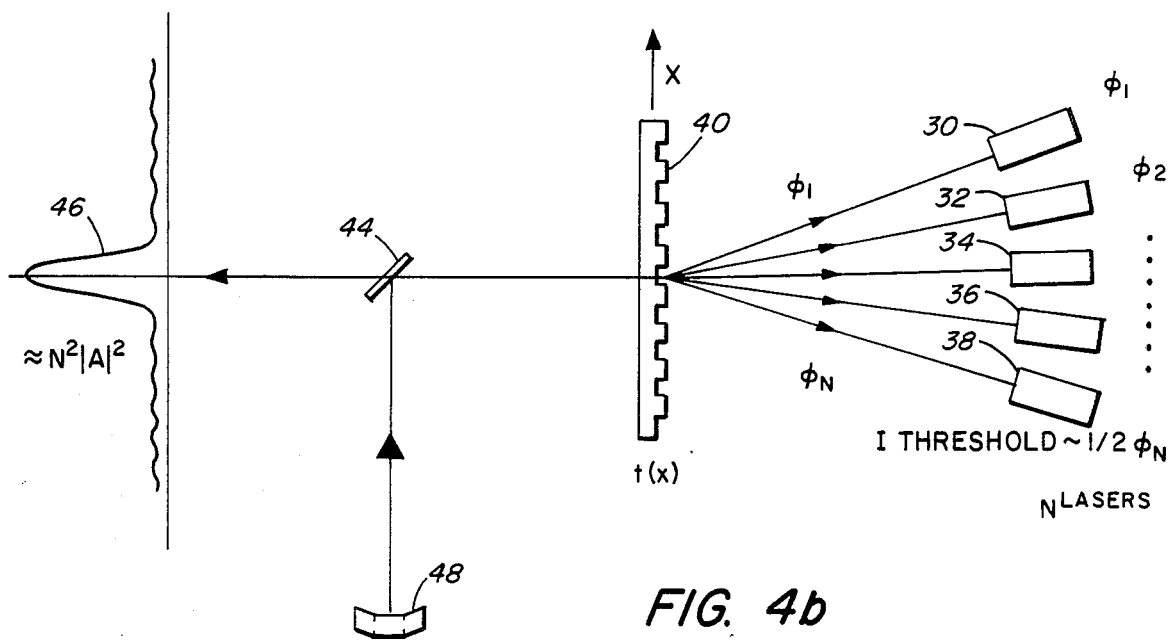
Figure 5:
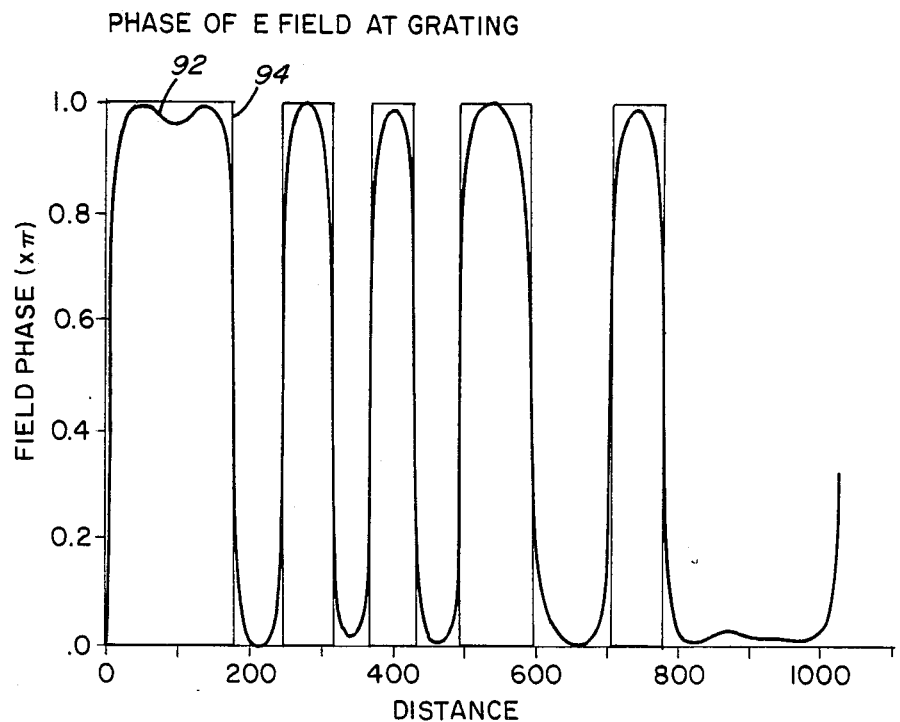
FIG. 5 is a graph of electric field phase versus distance at the binary grating designed for addition of nineteen laser beams.
Figure 6:
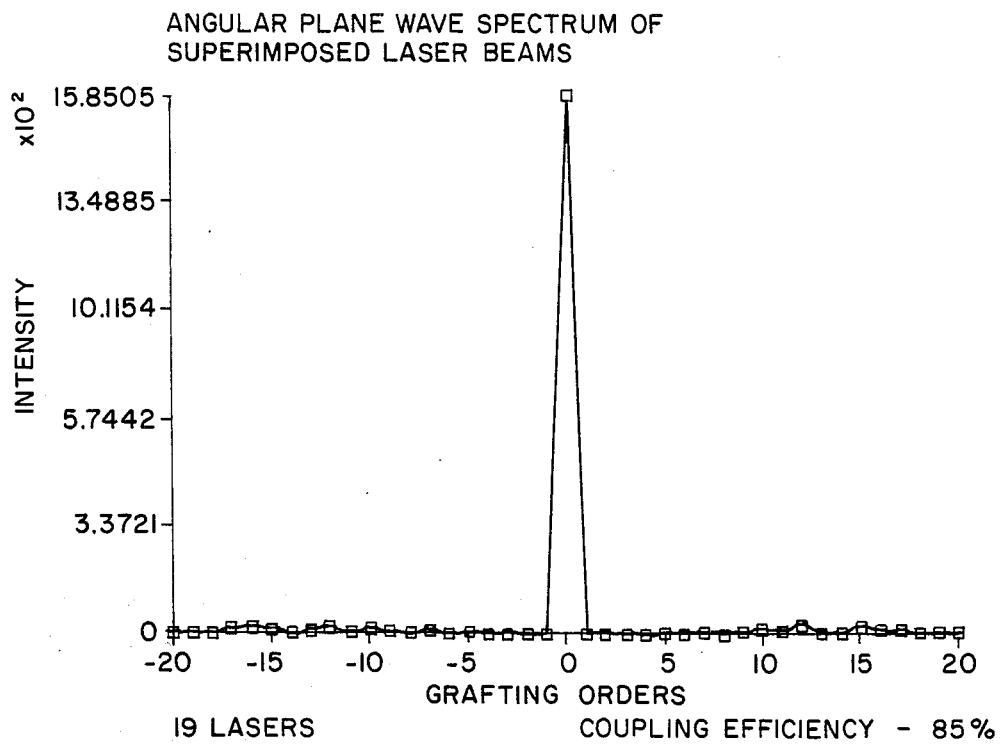
FIG. 6 is a graph of the angular plane-wave spectrum of the summed plurality of beams.

The applicants herein further recognized that instead of using a diffraction grating to disperse a single laser beam into multiple beams, multiple lasers could be combined to form a single beam as well. An example of this concept is shown in FIGS. 4a and 4b. The lasers 30, 32, 34, 36, 38, etc. are arranged to illuminate a binary diffraction grating 40 to be described in greater detail hereinbelow. The grating 40 has a dispersion characteristic substantially as shown in FIG. 3. However, if the lasers 30-38, etc. are simply turned on to illuminate the grating 40, the individual beams will not be coherently added because the phase relationships among the various lasers will not be appropriate for coherent addition. In other words, the lasers 30-38, etc. do not "talk" to one another so that there is no fixed relationship among the phases of the various lasers. If the various beams, therefore, are to be combined coherently, a way must be found to lock the lasers together for proper phasing of the individual beams. One way to accomplish such phase locking is to provide an injection lock laser 42. The injection lock laser 42 produces a reference beam which is reflected onto the diffraction grating 40 by a beam splitter 44. As the reference beam from the injection-lock laser 42 passes through the diffraction grating 40 in the reverse direction, it splits into a number of locking beams with the correct phase relationships which then illuminate the array of lasers 30-38, etc. This wave front locks each of the lasers to the reference and provides the proper phasing for coherent addition by the diffraction grating 40, in the forward direction. Thus, the grating 40 serves both to diffract the reference beam from the injection lock laser 42 for the purpose of locking together the phases of the lasers 30-38, etc. and also coherently combines the beams from the lasers into a single beam having a higher intensity as illustrated by the curve 46. That is, the beams from the lasers 30-38, etc. interfere and the sum of the E-fields has a phase distribution which is approximately conjugate to the transmittance of the grating. The phase of this field is, therefore, cancelled by the grating to produce an approximation to a single plane wave. For example, FIG. 5 shows a calculation of the phase of the electric field produced by nineteen lasers just before their interaction with the grating. It should be noted that the phase of the electric field 92 follows the grating profile 94 very closely. Thus, when the light passes through a grating of proper depth, the phase of the resulting light is close to uniform. The Fourier transform of the electric field at the grating is shown in FIG. 6, and illustrates that the majority of the light is contained in the zero order plane wave. In particular, 85% is contained in that zeroth order.

Referring back to FIG. 4a, the injection lock laser 42 may be replaced by a mirror 48 as in FIG. 4b to effect proper phasing for the lasers 30-38. In this case, light from one of the lasers, such as the laser 38, will pass through the diffraction grating 40, be reflected by the beam splitter 44 onto the mirror 48 from which it will be reflected back to the beam splitter 44 and then dispersed by the grating 40 to illuminate the lasers 30-38. Therefore, mirror 48 becomes part of a common cavity among lasers 30 to 38, etc. It should be noted again at this point that the number of lasers illustrated in FIG. 4 is entirely general.

Figure 7A:
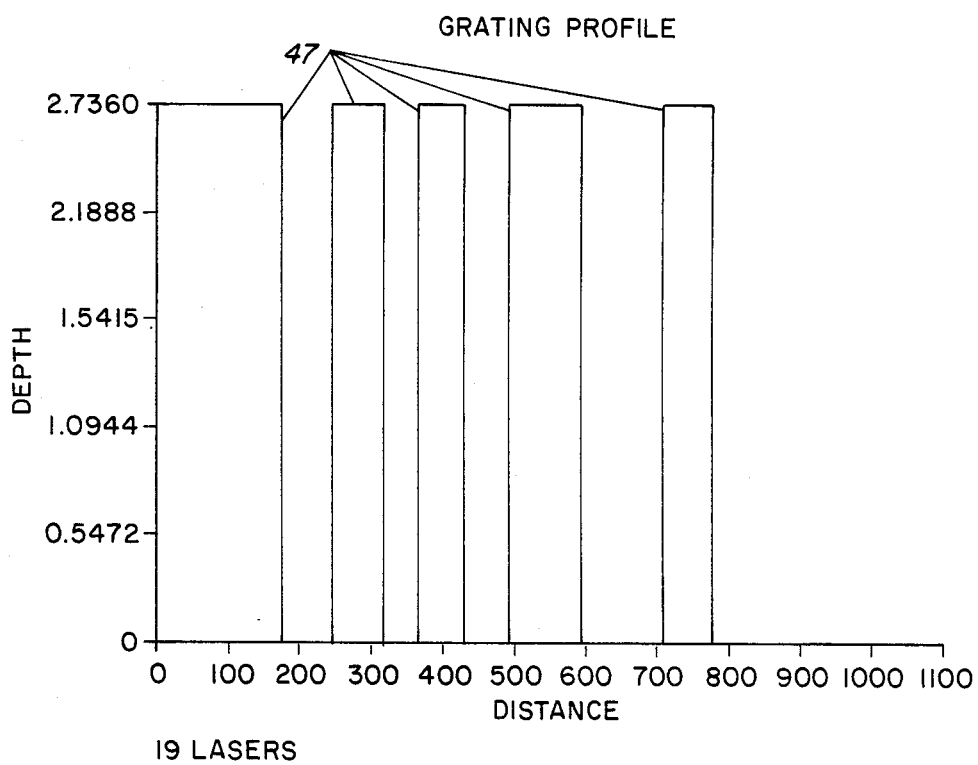
FIG. 7a is a graph of a single period of a binary diffraction grating producing nineteen diffraction orders with equal intensity.
Figure 7B:
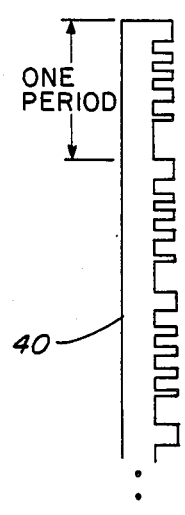
Figure 8:
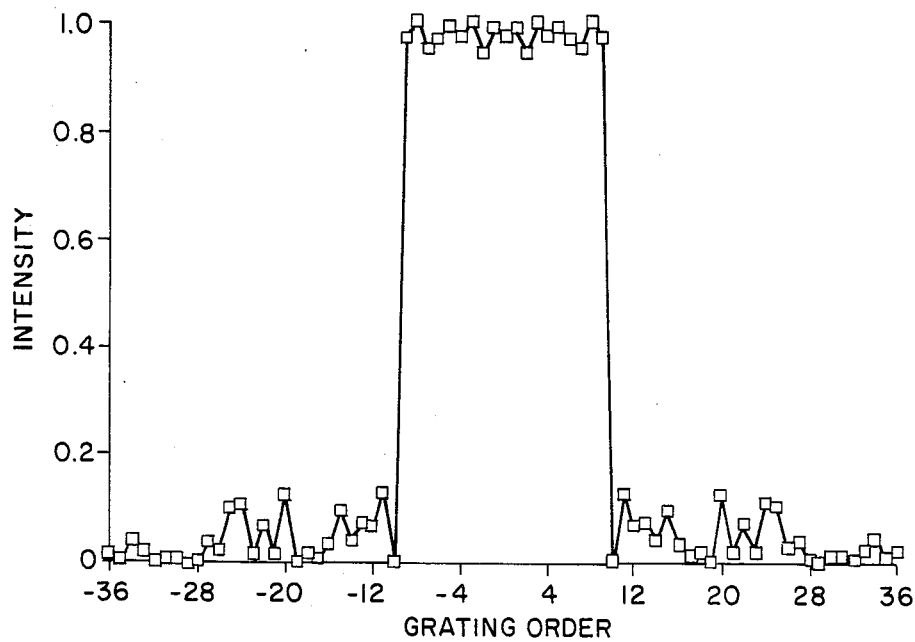
FIG. 8 is a graph of the calculated intensity versus grating order produced by the grating of FIG. 7 designed for addition of nineteen laser beams.
Figure 9A:
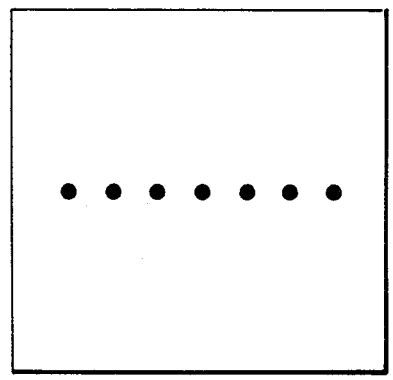
FIG. 9a is an experimental demonstration of the response to a single laser beam of a grating designed to add 7 laser beams.
Figure 9B:
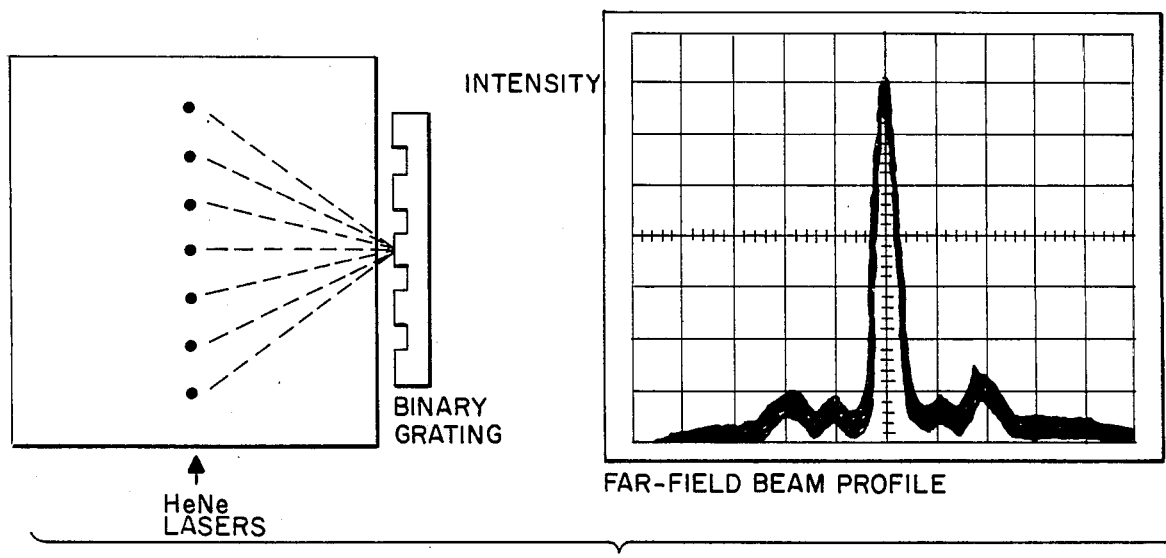
FIG. 9b is an experimental demonstration of the addition property of a grating designed for 7 lasers. 7 beams with appropriate phase relationships have been combined to produce one strong plane wave (central spike in oscilloscope trace)

As has been stated above, the diffraction grating 40 has a configuration to produce the desired grating dispersion as illustrated in FIG. 3, that is, a grating which will generate a finite number of diffraction orders having substantially equal intensity while suppressing sharply all higher orders. An example profile of such a grating is shown in FIGS. 7a and 7b. As shown in these figures, the binary diffraction grating 40 is made up of periodic elements, each element consisting of rectangular steps 47, whose specific widths, positions, and depth are determined by the number of laser beams. The diffraction grating 40 of FIG. 7b, made up of the elements illustrated in FIG. 7a, will produce the diffraction pattern shown in FIG. 8. Note that the intensities of the central 19 orders have substantially the same value. Furthermore, the intensities of the higher orders are substantially suppressed. Thus, this grating has the desired diffraction characteristic illustrated in FIG. 3. It should again be emphasized that the gratings of FIGS. 7a and 7b and the diffraction pattern of FIG. 8 are for the case of the nineteen lasers 30-38, etc. of FIG. 4a, and is entirely exemplary. The present invention is entirely general with regard to the number of lasers. An experimental verification of the beam splitting and beam combining properties of the gratings was obtained using a grating designed for the addition of 7 laser beams. The optical response of the grating to a single laser beam is shown in FIG. 9a where the single beam has been split into 7 equal beams. In FIG. 9b, 7 equal strength beams with the proper phase relationship are added by the grating such that most of the energy is coupled into a single plane wave (central peak of oscilloscope trace).

The techniques for determining the specific profiles for binary diffraction gratings for use with an arbitrary number of lasers will now be described. There are several possible ways to generate the proper grating profile and depth for coherent laser beam addition. The first approach uses an iterative algorithm on a computer. Constraints are placed on the solution both in the grating and angular plane wave domains (these domains are Fourier transforms of each other). For example, if N laser beams are to be added, the constraint in the angular plane wave domain requires N delta functions to be present, with these delta functions having the same amplitude within a cetain error range. The constraint in the grating domain is simply that the grating function be binary and phase only. This constraint is desirable for manufacturing purposes only, and better results could be achieved if the constraint were relaxed. The iteration procedure starts with an arbitrary grating profile which satisfies the given constraints. The angular plane wave spectrum of this profile is produced by calculating the Fourier transform of the grating profile. In general, the transform will not satisfy the constraints in the angular plane wave domain. These constraints are applied and the new grating profile is produced by calculating the inverse transform of the result. The process of applying constraints and transforming is repeated until the solution coverges. This algorithm has been used successfully in other synthesis problems where constraints must be satisfied, such as by J. R. Fienup in *Appl. Opt.* 18 (1979).

A second method which can be used is discussed by Killat, et al. in *Fiber and Integrated Optics* 4 (1982) in the context of conveying light from one input port to multiple output ports of optical fibers. Optimization is obtained by using a numerical technique based on the method of the augmented Lagrangian function as discussed by W. Murray in "Methods of Constrained Optimization", in *Optimization in Action*, L. C. W. Dixon, ed., London, Academic Press (1976). In some cases, the optimal grating profile can be derived analytically. W. H. Lee, in *Appl. Opt.* 18 (1979) has used the theory of pulse width modulation and pulse position modulation to calculate the grating profile for some simple cases.

The discussion so far has been directed to binary diffraction gratings, that is, surface relief gratings with two phase levels only. Such gratings are preferred because they can be manufactured using existing lithographic and etching technologies. It is recognized that higher coupling efficiencies could be achieved with diffraction gratings having non-binary profiles. In such a grating, for example, the grating profiles illustrated in FIG. 7a might vary in height or have a non-rectangular shape. It is intended that such more nearly optimal gratings be included within the scope of the present invention.

Figure 10:
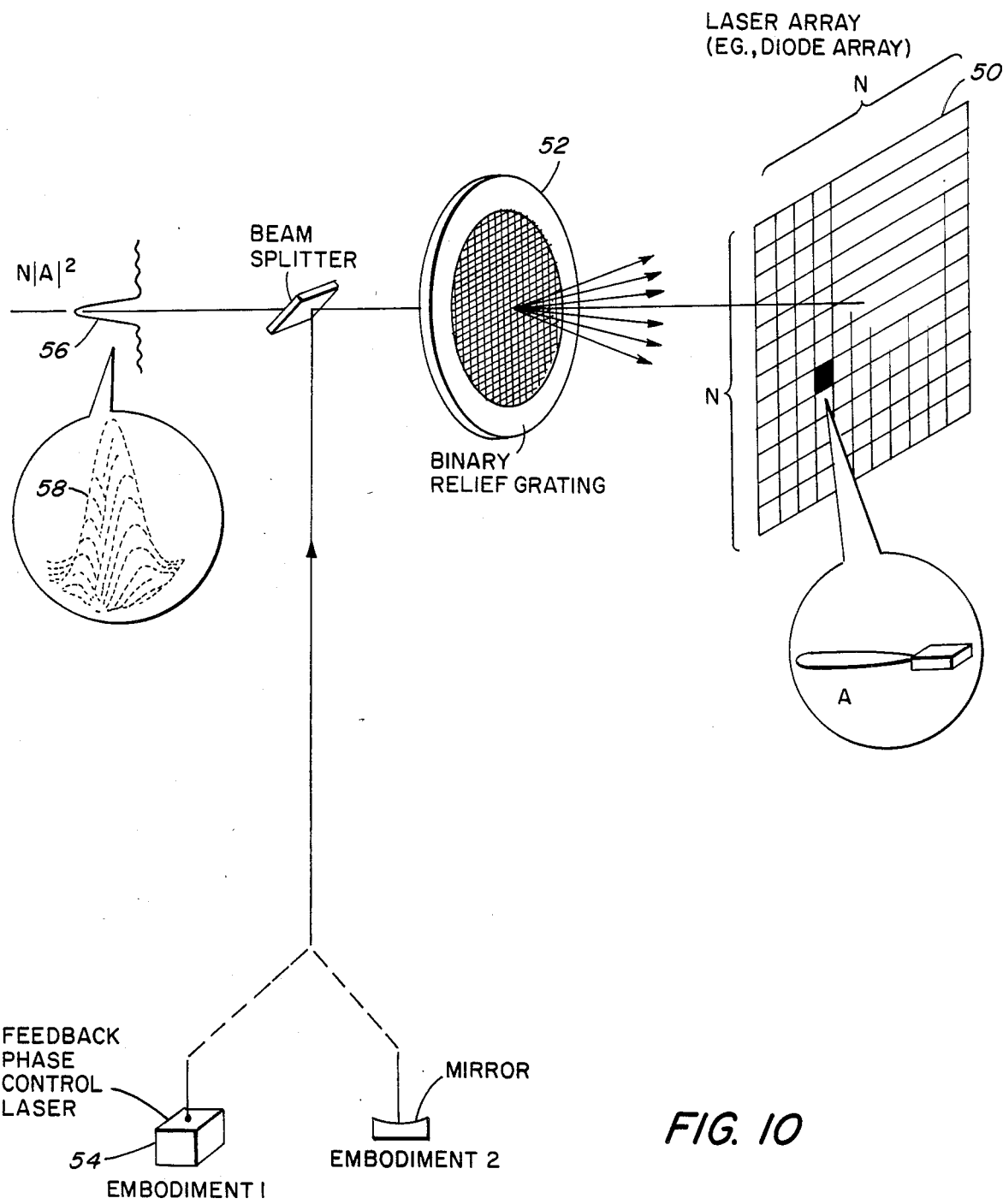
FIG. 10 is a schematic diagram of the present invention for use with a two-dimensional laser array using a two-dimensional grating.
Figure 11:
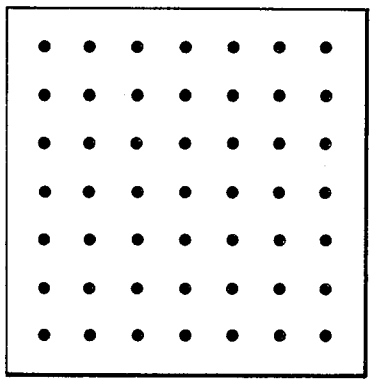
FIG. 11 is an experimental demonstration of the response to a single laser beam of a grating designed to add 49 laser beams in a two dimensional array.

FIG. 10 illustrates the use of a two-dimensional array of lasers in conjunction with a two-dimensional diffraction grating for coherently combining the beams of a plurality of lasers. In particular, a two-dimensional array 50 of semiconductor lasers is arranged so that each of the lasers in the N by N array 50 illuminates a binary relief grating 52 capable of dispersions in two dimensions. Conceptionally, the array 52 is made up of two of the one-dimensional arrays 40 of FIG. 7b oriented orthogonally to one another. As with the one-dimensional embodiment of FIG. 4, an injection lock laser 54 is provided to produce a reference beam for insuring the proper phase relationship among the lasers in the array 50. In this way, the output of the individual lasers in the array 50 is combined to produce a coherent beam 56 having the characteristics 58 illustrated in the inset on FIG. 10. If, for example, the array 50 were a 10×10 array of 100 lasers, the output of these lasers will be combined coherently to produce the beam 56. If the lasers in the array 50 were relatively low power semiconductor lasers, their output could be combined to produce a single powerful coherent beam, with up to 100 times the power of a single laser source. Thus, the high reliability and compactness of semiconductor lasers can be utilized in higher power applications which in the past would have required the use of high power gas lasers. The configuration for a two-dimensional binary diffraction grating 52 would be determined as discussed above with reference to a one-dimensional array. It should be noted that the two-dimensional binary grating 52 might actually consist of a first, one-dimensional grating spatially separated (by the Talbot distance) from an orthogonal second one-dimensional grating to produce two-dimensional dispersion characteristics. This configuration has been experimentally proven, and is shown in FIG. 11 for 49 beams in a 7×7 array. The grating response to a single beam is seen to be an array of 49 bright points.

Figure 12:
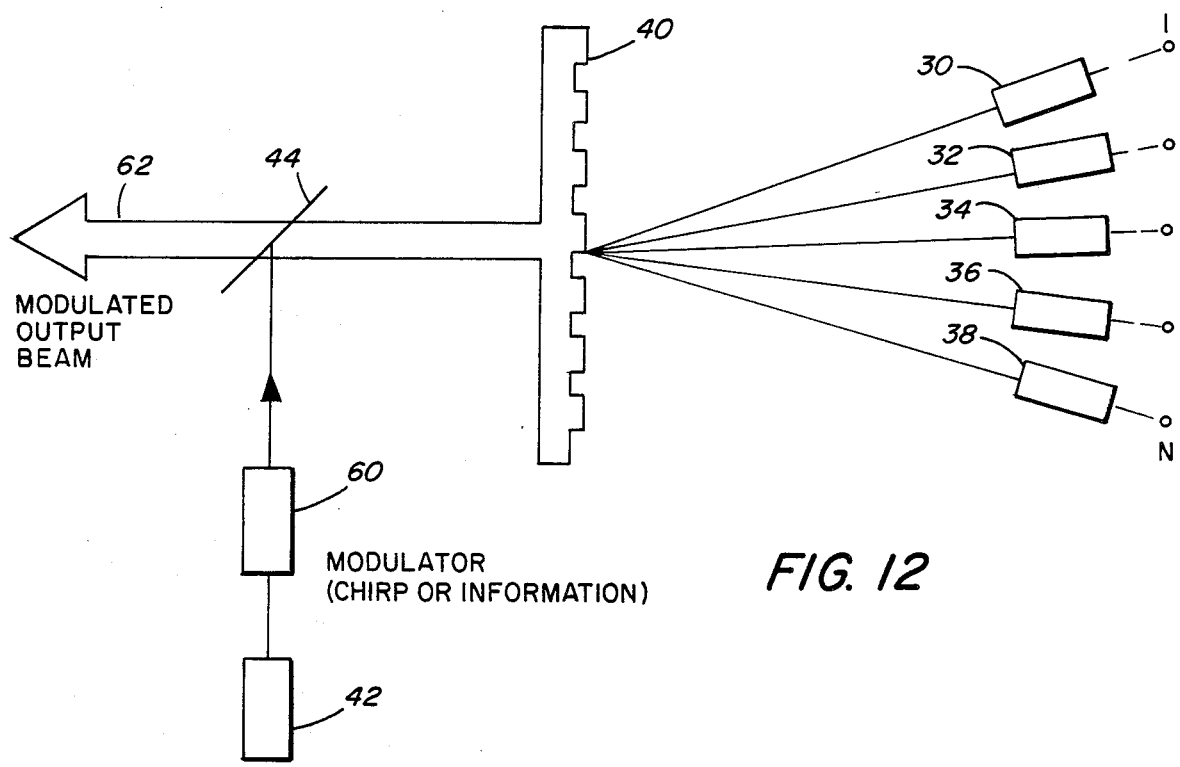
FIG. 12 is a schematic illustration of an optical amplifier disclosed herein where the reference laser beam is modulated. This can be achieved by an external modulator, or by modulation of the reference laser itself.

FIG. 12 illustrates an optical amplifier based on the coherent addition of a plurality of laser beams as discussed above. As in the configuration of FIG. 4a, the N lasers 30–38, etc. are shown in FIG. 12 illuminating the diffraction grating 40. To create an amplifier, a modulator 60 is interposed between the injection lock laser 42 and the beam splitter 44. In this way, the reference beam from the injection lock laser 42 is modulated which in turn modulates the combined output beam 62 which is a coherent addition of the beams from the lasers 30–38. The arrangement of FIG. 12 is, in effect, an optical transistor in that a small modulated signal controls a much stronger signal. The optical amplifier of FIG. 12 will have uses in long distance communications and laser radars.

It is thus seen that the objects of this invention have been achieved in that there has been disclosed apparatus and method for coherently combining the output of a plurality of lasers into a single, more powerful beam. The invention utilizes binary diffraction gratings which can be readily manufactured with known semiconductor technology. The addition of a modulator element results in an optical amplifier. It is recognized that modifications and variations will occur to those skilled in the art and it is intended that all such modifications and variations be included within the scope of the appended claims.

What is claimed is:

1. Apparatus for coherently combining electromagnetic radiation from a plurality of lasers comprising:
    a diffraction grating;
    means for supporting said plurality of lasers to illuminate said grating; and
    means for locking together the phase of said plurality of lasers;
    said diffraction grating having a configuration to generate substantially equal intensities of diffraction orders corresponding to the number of said plurality of lasers while suppressing higher orders.

2. Apparatus of claim 1 wherein said diffraction grating is binary.

3. Apparatus of claim 1 wherein said diffraction grating is a one-dimensional array.

4. Apparatus of claim 1 wherein said diffraction grating is a two-dimensional array.

5. Apparatus of claim 1 wherein said means for locking together the phase of said lasers comprises an injection lock laser.

6. Apparatus of claim 5 wherein said injection lock laser light is dispersed by said grating into each of said plurality of lasers.

7. Apparatus of claim 1 wherein said means for locking together the phase of said lasers comprises a mirror for reflecting light onto said grating for dispersion onto said plurality of lasers.

8. Optical amplifier comprising:
a diffraction grating;
a plurality of lasers located to illuminate said grating;
injection lock laser means for locking together the phase of said plurality of lasers; and
modulator means for modulating the output of said injection lock laser;
said diffraction grating having a configuration to generate substantially equal intensities of diffraction orders corresponding to the number of said plurality of lasers while suppressing higher orders.

9. The optical amplifier of claim 8 wherein said diffraction grating is binary.

10. The apparatus of claim 8 wherein said diffraction grating is a one-dimensional array.

11. The apparatus of claim 8 wherein said diffraction grating is a two-dimensional array.

12. The apparatus of claim 1 wherein said plurality of lasers is a diode laser array.

* * * * *